United States Patent [19]

Granot

[11] Patent Number: 4,777,439

[45] Date of Patent: Oct. 11, 1988

[54] SPATIALLY LOCALIZED SPECTROSCOPY

[75] Inventor: Joseph Granot, Holon, Israel

[73] Assignee: Elscint Ltd., Haifa, Israel

[21] Appl. No.: 28,204

[22] Filed: Mar. 20, 1987

[30] Foreign Application Priority Data

Mar. 24, 1986 [IL] Israel .................................. 78240

[51] Int. Cl.[4] ............................................. G01R 33/20
[52] U.S. Cl. ....................................................... 324/309
[58] Field of Search ................. 324/307, 309; 128/653

[56] References Cited

U.S. PATENT DOCUMENTS

| | | | |
|---|---|---|---|
| 2,759,170 | 8/1956 | Anderson et al. | 324/312 |
| 4,443,760 | 4/1984 | Edelstein et al. | 324/314 |
| 4,480,228 | 10/1984 | Bottomley | 324/309 |
| 4,563,647 | 1/1986 | Young | 324/309 |

OTHER PUBLICATIONS

Frahm, J. et al., "Localized Proton Spectroscopy Using Stimulated Echos", J. Mag. Res., 72, 502-508 (1987).
F. W. Wehrli et al., "Parameters Determining the Appearance of NMR Images", General Electric, copyright 1984.
P. C. Lauterbur, "Image Formation by Induced Local Interactions: Examples Employing Nuclear Magnetic Resonance", Nature, vol. 242, Mar. 16, 1973, pp. 190-191.
R. E. Gordon & R. J. Ordidge, "Volume Selection For High NMR Studies", Proceedings of the SMRM Third Annual Meeting, 1984, pp. 272-273.
W. P. Aue et al., "Volume-Selective Excitation-A Novel Approach to Topical NMR", Journal of Magnetic Resonance, 56, 350-354 (1984).
J. Frahm et al., "Stimulated Echo Imaging", Journal of Magnectic Resonance, 64, 81-93 (1985).

Primary Examiner—Tom Noland
Assistant Examiner—Lawrence G. Fess
Attorney, Agent, or Firm—Sandler & Greenblum

[57] ABSTRACT

A method of obtaining spatially localized spectroscopic signals by using RF pulse sequences in the presence or gradient fields to generate stimulated echoes.

6 Claims, 3 Drawing Sheets

SPATIALLY LOCALIZED SPECTROSCOPY

FIELD OF THE INVENTION

This invention relates to nuclear magnetic resonance spectroscopy and more particularly to methods for spatially localizing the MR chemical shift signals obtained in NMR spectroscopic experiments.

BACKGROUND OF THE INVENTION

NMR chemical shift spectroscopy has been in use for a relatively long time. For example, in 1950 E. L. Hahn published an article in the Physical Review, volume 80, pp 580 which disclosed a sequence to obtain stimulated echo signals (STE) for use in spectroscopic experiments. In 1973 P. C. Lauterbur in an article published in Nature (London) 242, 89/90 disclosed the use of field gradients for determining the source location of free induction decay (FID) signals obtained in NMR experiments.

It has long been known that when atomic nuclei that have net magnetic moments are placed in a strong static magnetic field, the nuclei ("spins") precess about the axis of the field at the Larmor frequency given by the equation:

$$f = \gamma B_o / 2\pi$$

in which:
- $\gamma$ is a gyromagnetic ratio, constant for each NMR isotope which exhibits a net magnetic moment;
- $B_o$ is the strength of the magnetic field; and
- $\pi$ is the well known constant 3.1416+.

The angular velocity of the precesion is primarily dependent on the strength of the magnetic field $B_o$ and increases with increasing field strength. The chemical shifts occuring where the Larmor NMR frequency of the nuclei of the same element differ because of different magnetic environments produced by differences in their chemical environment. For example, electrons partially shield the nuclei from the external magnetic field and thereby affect the resonant frequency. The degree of shielding caused by the electrons depends on the chemical environment of the nucleus. Thus, the chemical shift spectrum of a given molecule is unique and can be used for identification purposes. Since the resonant frequency and hence the absolute chemical shift depend on the applied field, the chemical shift spectrum is expressed in fractional parts per million (ppm) of the NMR frequency relative to an arbitary reference compound.

For example, the range of chemical shifts is about 10 parts per million for protons, 30 parts per million for phosphorus-31, and 200 parts per million for carbon-13. In order to discern small chemical shifts the homogeneity of the field $B_o$ must exceed differences in chemical shifts of the peaks in the spectrum and typically must be better than one part in one million.

In conventional NMR spectroscopy, chemical shifted signals are absorbed from the whole of the sample placed in the region to which the NMR coil is sensistive. This is satifactory for studying the chemical structure of homogeneous samples in vitro; however, to enable discrimination of normal and abnormal conditions in medical diagnostic applications in vivo it is necessary to spatially discriminate signal components in the sample. Thus, in diagnostic applications of spectroscopy it is not satisfactory when signals are observed from the whole of the NMR sample. For example where the sample is a part of a human body, the sample is notoriously non-homogeneous. Accordingly, it is necessary to obtain signals from small volumes of interest from within the human body in vivo in the large static magnetic field.

Localization of the volume of interest is critically important for such NMR medical diagnostic studies in vivo. Selection of a cubic volume can be achieved by application of RF pulse sequences comprising three consecutive tailored RF pulses, each in the presence of a different one of the three orthogonal gradients. The use of such pulses sequences such as 90 degrees, 180 degrees and 180 degrees has been reported by R. E. Gordon and R. J. Ordidge, in a report entitled "Volume Selection for High Resolution NMR Studes" in the Proceedings of the SMRM Third Annual Meeting, 1984 at pp 272 et seq. A pulse sequence using a composite pulse such as selective 45 degrees, non-selective 90 degrees and selective 45 degrees with the composite pulse applied three times has been reported in an article by W. P. Aue, S. Muller et al in the Journal of Magnetic Resonance, vol 56 pp 350 et seq. "A Selective Volume Method for Performing Localized NMR Spectroscopy", is the subject of the U.S. Pat. No. 4,480,228 which were issued on Oct. 30, 1984.

The 90-180-180 prior art pulse sequence procedure for spatially localizing the spectroscopic signals received yields signals that are strongly dependent on the T2 relaxation times of the spins that provide the signals. This dependance on the T2 relaxation times makes it difficult to detect signals with short T2 relaxation times, for example, the signals of phosphorus nuclei of ATP, in vivo.

Another problem with the prior art pulses sequence methods for spatially localizing the spectroscopic signal is that the RF power used tends, to heat the tissue of the subject. It is therefore incumbent on the designers of such methods to minimize the RF power deposition.

Yet another problem caused by the employment of 180 degree RF pulses is the poor definition of the selected volume.

The ability to obtain stimulated echoes as previously noted has been known to those skilled in the art for a long time. It is also known that among the benefits obtained by using stimulated echoes in NMR imaging for example, is that no 180 degree pulses are needed. Therefore, when acquiring data using stimulated echoes, the applied power is considerably reduced as compared to the spin echo data acquisition sequences.

In an article entitled "Stimulated Echo Imaging" by J. Frahm, et al which appeared in the Journal of Magnetic Resonance, Vol. 64, pp 81-93, (1985) is was noted that stimulated echo imaging has reduced dependence on T2 relaxation time and that RF power is reduced. However, until now nobody has applied stimulated echo pulse sequences for acquiring spectroscopic data of spatially localized volumes.

Accordingly solutions to the problems of obtaining spatially localized spectroscopic data are still being sought. The desired method should have reduced dependance on the T2 relaxation time in order to detect signals from nuclei with short T2 relaxation times, in vivo. Also, spectroscopic data acquisition methods are being continuously sought wherein lower RF power can be used for acquiring the data. In addition the desired method should provide more precise definition of the volume and eliminate unwanted signals from regions outside of the region of interest.

BRIEF DESCRIPTION OF THE INVENTION

Accordingly it is an object of the present invention to obtain spatially localized spectroscopic signals using pulse sequences for generating stimulated echoes. More particularly, according to the present invention a method for performing localized chemical shift spectroscopy is provided, said method comprises the steps of:

aligning spins in a sample by positioning said sample in a homogenous static magnetic field for obtaining NMR derived data from the sample, irradiating said sample with a first radio frequency (RF) pulse in the presence of a first magnetic gradient so as to nutate the aligned spins in a planar slice of said sample, applying a second RF pulse in the presence of a second magnetic gradient normal to said first magnetic gradient so as to further nutate said nutated spins in a first strip of said planar slice, applying a third RF pulse in the presence of a third magnetic gradient normal to said first and second magnetic gradients to still further nutate the further nutated spins of said first strip of said slice, in a second strip, and selecting said first, second and third RF pulses to generate a stimulated echo from said still further nutated spins.

A feature of the present invention includes utilization of 90 degree selective pulses, for obtaining the stimulated echoes.

A further feature of the invention utilizes a second gradient that extends past the RF pulse in order to destroy coherence.

A further feature of the invention provides means to cancel transverse magnetization generated by the third pulse. The cancellation method includes applying the stimulated echo sequence at least twice, in the second application the phase of the first RF pulse is inverted and the acquired signal is subtracted from that acquired in the first application.

Yet another feature of the invention is that both the position and the size of the volume can be readily selected by appropriate choice of frequency and bandwidth of the three RF pulses along with controlling the strength of the selection gradients. The choice is made according to the following equations:

slice position $x = 2\pi \Delta f / \gamma G x$; and slice width $x = 2\pi \Delta F / \gamma G x$ where: x is the location along the X axis, as an example, (could also be Y or Z);

$\Delta f$ is an offset frequency (added to the Larmor frequency); and $\Delta F$ is the bandwidth of the RF pulse.

Another feature of the invention is that the stimulated echo procedure enables the simultaneous acquisition of signals of data from multiple localized volumes, using methods such as disclosed in the patent application Ser. No. 892,063 filed in the U.S. on 1st Aug. 1986.

BRIEF DESCRIPTION OF THE DRAWINGS

The above claimed and other features and objects of the present invention will be best understood when considered in the light of the following description made in conjunction with the accompanying drawings, wherein:

GENERAL DESCRIPTION

Figure 1:
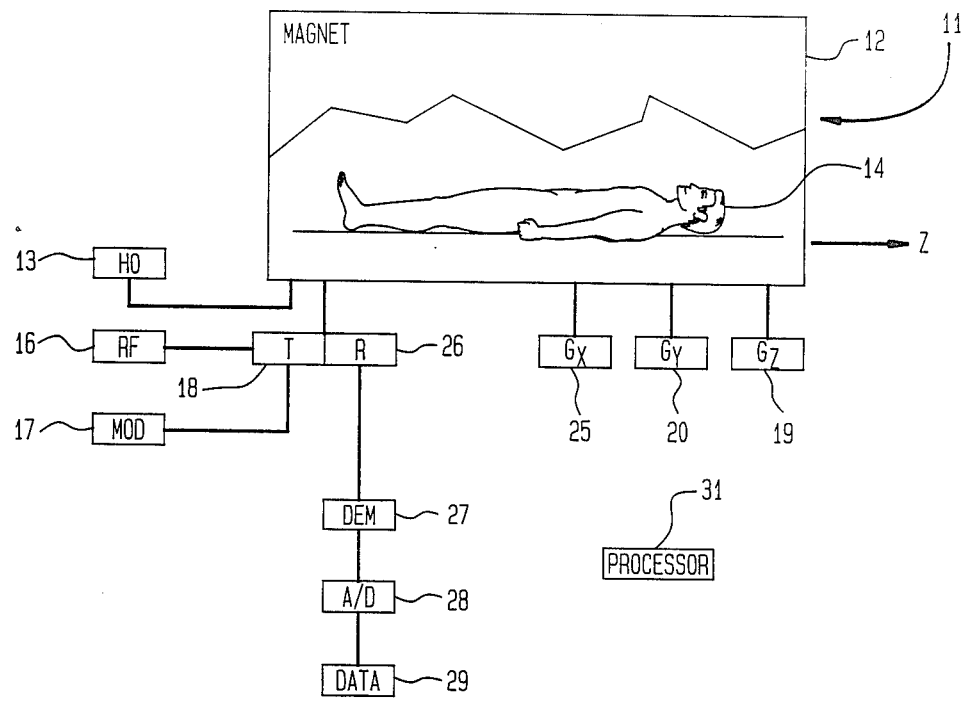
FIG. 1 is a block diagram showing of a typical NMR spectroscopic data, acquisition system.

FIG. 1 at 11 shows in block diagram form an in vivo spectroscopic data acquisition system. The system includes a magnet 12 for generating a large static magnetic field. The magnet is sufficiently large to have a bore into which a patient can fit. The patient is positioned and the magnetic field is generated by a magnetic field generator indicated at 13 by block Ho. The RF magnetic pulses are generated utilizing RF generator 16. The pulses are shaped using modulator 17. The shape of the pulse could be Guassian or Sinc, for example. Shaped pulses act to restrict the area of the sample effected by the RF pulse.

Figure 2:
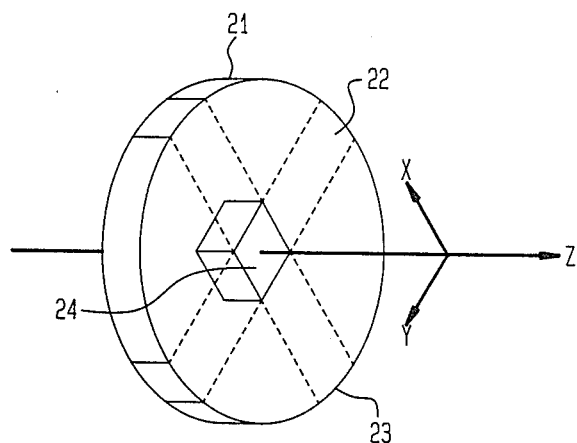
FIG. 2 is a pictorial showing a selected volume in a selected slice of a sample.

The modulated RF pulse signal is transmitted onto coils not shown in the magnet. As previously mentioned, the coils may be surface coils. With this invention however, surface coils are not required but can still can be used. The RF pulse is applied in the presence of gradients such as a Z gradient generated by gradient generator 19. The pulse transmitted by the transmitter 18 in the presence of the gradient pulse selects a planar section 21 from the patient 14 as shown in FIG. 2.

A specified time, say t1, after the application of the first RF pulse the second RF pulse is applied. The second RF pulse is also shaped. It too is applied in the presence of a magnetic field gradient generated by gradient generator 20. However, the magnetic gradient now is in the Y direction and causes a strip 22 in the planar section 21 to be excited. The first RF pulse nutates aligned spins in the planar section 21. The second RF pulse further nutates the nutated spins of planar section 21 that are located in the strip 22.

At a time such as time t2 for example, after the application of the second RF pulse, a third RF pulse is applied. The pulse is also shaped. The third pulse is applied in the presence of an X gradient, generated by the gradient generator 25. The third RF pulse in the presence of the X gradient excites the spins in a second strip indicated as 23. The excitation of the spins in the second strip still further excites the spins of the strip 22 that are intercepted by and located in strip 23. Thus the junction of strip 22 and 23 of planar section 21 actually defines a volume 24 from which stimulated echo signals are received. Each of the pulses are substantially 90 degree pulses. The stimulated RF signals are received in the absence of any gradient.

The received signals are detected by receiver coils in the magnet which are not shown. The receiver coils and the transmitter coils may be the same. The received signal is demodulated by demodulator 27. The demodulated signal is amplified and processed in the analog to digital processing unit 28 to provide spectroscopic data as indicated at 29. The entire process is monitored and controlled by the processor 31.

Figure 3:
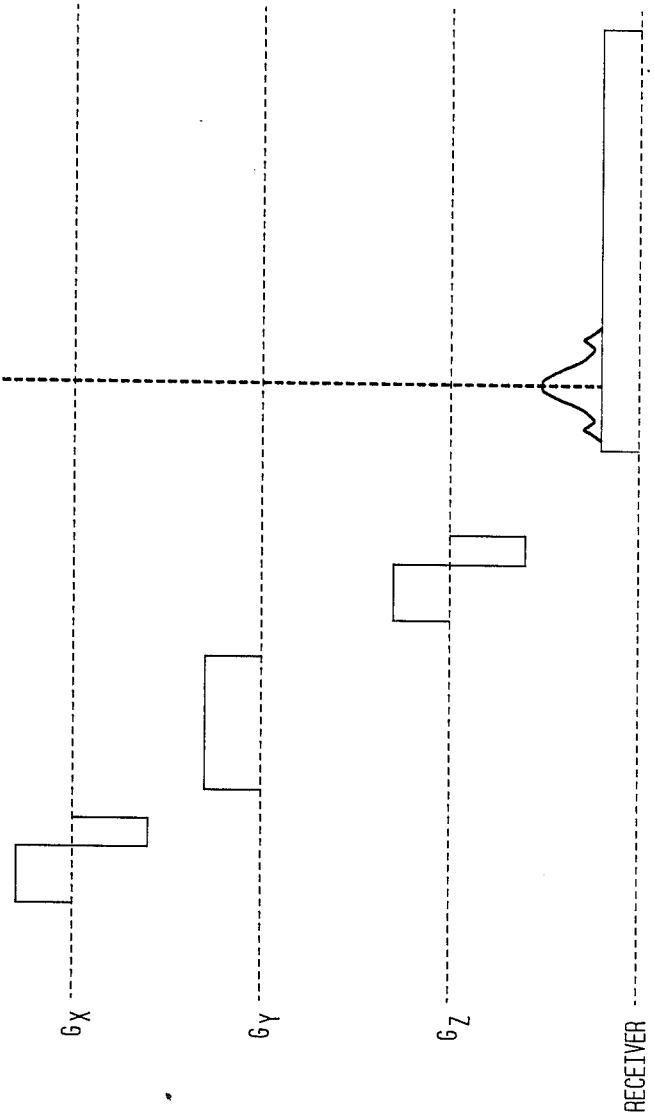
FIG. 3 is a showing of the RF pulse sequence used to obtain the spectroscopic data according to the invention.

The pulse sequence is more clearly indicated in FIG. 3. Therein, the first shaped RF pulse P1 is shown as being applied in the presence of an X gradient. Thus pulse causes the excitation and 90 degree nutation of the spins in the slice 23. The splice is along the Z axis, throughout the whole body of the patient. However, after a time t1, a second RF shaped pulse P2 is applied. It is of sufficient time magnitude to nutate the RF spins in the sample by 90 degrees. The pulse P2 is applied in the presence of a Y gradient to accordingly select the strip 22 in the patient.

At a time t2 after the application of the pulse P2, a third shaped 90 degree pulse P3 is applied, in the presence of the Z gradient to excite the spins in the planar section 21. The application of the three RF pulses and the three gradients as described selects the volume 24. The size of volume is controlled by the processor 31 which controls the strength of the gradient and the amplitude, duration and frequency of the pulses.

Figure 4:
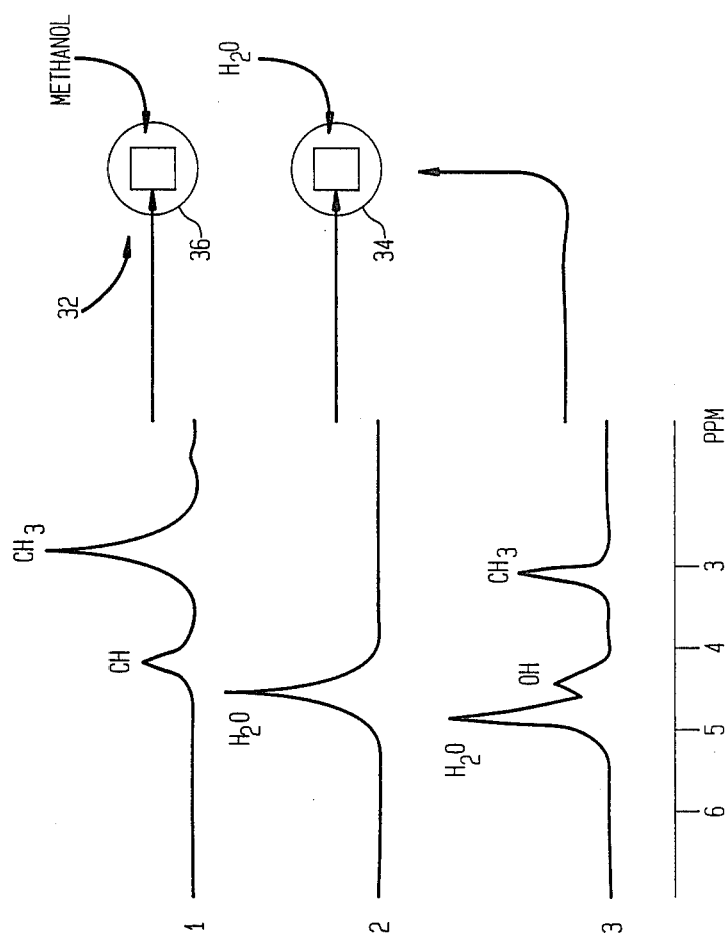
FIG. 4 shows the phantom and spectra from the phantom.

At a time t3 after the application of pulse P3, the stimulated echo signals are received in the absence of any gradients. The spatially localized spectra shown in FIG. 4 were acquired from a phantom 32 also shown in FIG. 4 made up of a tube 34 containing water and a tube 36 containing methanol.

The spectrum indicated at 1 was obtained from a volume of interest located in the methanol tube as indicated. The spectrum at 2 was obtained from a volume of interest located in the water tube. The spectrum at 3 was obtained from a volume of interest that included both tubes.

It is noted that the order of the application of the pulses is not critical. It should further be noted that t3 is equal to t1. In other words a stimulated echo is received at a time t3, after the third pulse equal to the time t1 between the first and second pulses. It is further noted that t2 is larger than t1.

In a preferred embodiment, the first gradient GX as shown in FIG. 3 has a negative portion applied after the first RF pulse terminates. The negative portion extends for about half of the area of the positive portion of the first gradient pulse and is used for refocusing the spins. The second gradient pulse extends past the second RF pulse in order to destroy coherence. Unwanted transverse magnetization created by the third 90 degree pulse from the regions outside the volume of interest as well as spurious echoes are cancelled by a repetition of the sequence of FIG. 3 in which the repeated sequence uses a first pulse of 90 degree that is inverted relative to the first pulse of the first sequence. The acquired signal is then subtracted from that acquired using the first scan sequence. Note that the third gradient pulse also has a negative portion that is applied after the termination of the third RF pulse. The negative portion extends for approximately half of the time period of the positive portion of the same pulse.

Thus a system is provided for acquiring spectroscopic chemical shift data in which dependence on the T2 relaxation time is reduced. This enables the user to acquire signals with shorter T2 relaxation times. The RF power applied during the designated sequence is much lower than that necessitated in the use of the normal spin echo sequence employing 180 degree pulses. The technique described above provides special means for spatial localization for spectroscopic studies in vivo.

While the foregoing invention has been described using preferred embodiments, it should be understood that the preferred embodiment are shown by way of example only and not as limitations on the scope of the invention.

What is claimed is:

1. A method for performing localized NMR shift spectroscopy comprising the steps of:
    aligning spins in an in-vivo sample by positioning the sample in a homogeneous magnetic field for obtaining NMR derived data from the sample,
    irradiating said sample with a first 90 degree RF pulse in the presence of a first magnetic gradient so as to nutate the aligned spins in a first selected volume of said sample,
    irradiating said sample with a second 90 degree RF pulse in the presence of a second magnetic gradient normal to said first magnetic gradient so as to further nutate the aligned spins in a portion of said first selected volume of said sample,
    irradiating said sample with a third 90 degree RF pulse in the presence of a third magnetic gradient normal to said first and second magnetic gradients to still further nutate the further nutated spins in a section of said portion of said first selected volume, to thereby select a particular volume of the sample, and
    selecting said first, second and third 90 degree RF pulses to generate stimulated echo signals from said still further nutated spins.

2. The method of claim 1 wherein said pulses are shaped pulses.

3. The method of claim 1 including the step of extending said second magnetic gradient beyond the second RF pulse to destroy coherence.

4. The method of claim 1 including the steps of:
    applying the stimulated echo sequence at least twice,
    inverting the phase of the first RF pulse for the second application of the sequence, and
    subtracting the signal acquired using the inverted phase from the signal acquired with the non-inverted phase to thereby cancel transverse magnetization.

5. The method of claim 4 including the steps of:
    selecting the position of each of the selected volumes by selecting the frequency of the RF pulses;
    selecting the sizes of each of the selected volumes by selecting the bandwidth of the RF pulses, and
    selecting the amplitudes of the RF pulses.

6. The method for performing NMR shift spectroscopy comprising the steps of:
    aligning spins in a sample by positioning the sample in a homogeneous magnetic field for obtaining NMR derived spectroscopic data from the sample, said homogeneous magnetic field extending in the Z direction of an imaginary XYZ orthogonal coordinate system,
    irradiating said sample with a first 90 degree RF pulse in the presence of a first magnetic gradient so as to nutate the aligned spins into a slab in said sample, said slab being perpendicular to said Z direction,
    irradiating said sample with a second 90 degree RF pulse in the presence of a second magnetic gradient normal to said first magnetic gradient so as to further nutate the nutated spins in a first strip in said slab,
    irradiating said sample with a third 90 degree RF pulse in the presence of a third magnetic gradient normal to said first and second magnetic gradients to still further nutate the further nutated spins in a second strip in said slab, said second strip being normal to said first strip so that the selected volume is the intersection of the first strip and the second strip in said slab in said sample, said first, second and third RF pulses generating a stimulated echo signal from said still further nutated spins in said selected volume of said sample, and acquiring signals from other localized volumes of said sample during the same scan sequence by using the same sequence of steps during the time period between the receipt of the simulated echo signal until the spins substantially realign with the homogeneous magnetic field.

* * * * *